(12) United States Patent
Ashourloo et al.

(10) Patent No.: US 11,293,992 B2
(45) Date of Patent: Apr. 5, 2022

(54) FAULT DETECTION IN HYBRID DC-DC POWER CONVERTORS

(71) Applicant: NXP B.V., Eindhoven (NL)

(72) Inventors: Mojtaba Ashourloo, Toronto (CA); Venkata Raghuram Namburi, Brampton (CA); Gerard Villar Piqué, Eindhoven (NL); John Pigott, Phoenix, AZ (US); Olivier Trescases, Toronto (CA); Hendrik Bergveld, Eindhoven (NL); Alaa Eldin Y El Sherif, Plano, TX (US)

(73) Assignee: NXP B.V., Eindhoven (NL)

( * ) Notice: Subject to any disclaimer, the term of this patent is extended or adjusted under 35 U.S.C. 154(b) by 186 days.

(21) Appl. No.: 16/813,849

(22) Filed: Mar. 10, 2020

(65) Prior Publication Data

US 2020/0326384 A1 Oct. 15, 2020

(30) Foreign Application Priority Data

Apr. 15, 2019 (EP) .................................. 19169160

(51) Int. Cl.
*G01R 31/40* (2020.01)
*G01R 31/56* (2020.01)

(52) U.S. Cl.
CPC ............. *G01R 31/40* (2013.01); *G01R 31/56* (2020.01)

(58) Field of Classification Search
CPC ..... G01R 31/40; G01R 31/56; H02M 1/0095; H02M 1/32; H02M 3/155; H02M 3/07
USPC .................................. 324/764.01, 537, 500
See application file for complete search history.

(56) References Cited

U.S. PATENT DOCUMENTS

| | | | |
|---|---|---|---|
| 6,407,899 B1 | 6/2002 | Carpenter | |
| 7,443,055 B2 | 10/2008 | Pracht et al. | |
| 7,692,910 B2 | 4/2010 | Lavier et al. | |
| 8,385,030 B2 | 2/2013 | Maher | |
| 10,958,151 B2 * | 3/2021 | Ashourloo | H02M 1/00 |
| 11,023,591 B2 * | 6/2021 | Case | G06F 21/577 |
| 11,031,804 B2 * | 6/2021 | Peeters | H02J 7/0029 |
| 2008/0043499 A1 | 2/2008 | Wu et al. | |

(Continued)

OTHER PUBLICATIONS

Seo et al., "A 95%-Efficient 48V-to-1V/10A VRM Hybrid Converter Using Interleaved Dual Inductors", 2018 IEEE Energy Conversion Congress and Exposition (ECCE), Sep. 23, 2018, pp. 3825-3830.

*Primary Examiner* — Giovanni Astacio-Oquendo

(57) ABSTRACT

There are disclosed fault detection circuits and methods for an N-to-1 Dickson topology hybrid DC-DC power converter. A short circuit fault detection circuit comprises: first and second measuring circuits configured to measure first and second voltages, Vsw1, Vsw2, at the switching node in the first and second state; first and second calculation circuits configured to calculate first and second absolute error voltage as an absolute difference of the respective first and second voltages in one operating cycle (Vsw1[n−1], Vsw2[n−1]) and in a next subsequent operating cycle (Vsw1[n], Vsw2[n]); and first and second fault circuits configured to provide first and second fault outputs indicative of a fault in response to the respective first or second absolute error voltage exceeding a short-circuit-trip level. Open circuit fault detection circuits and methods are also disclosed.

18 Claims, 8 Drawing Sheets

(56) References Cited

U.S. PATENT DOCUMENTS

| | | |
|---|---|---|
| 2016/0028302 A1 | 1/2016 | Low et al. |
| 2020/0231024 A1* | 7/2020 | Shrivastava ....... B60H 1/00985 |
| 2021/0281154 A1* | 9/2021 | Xu ........................... H02P 6/34 |
| 2021/0311832 A1* | 10/2021 | Boschi .................. G06F 11/142 |

* cited by examiner

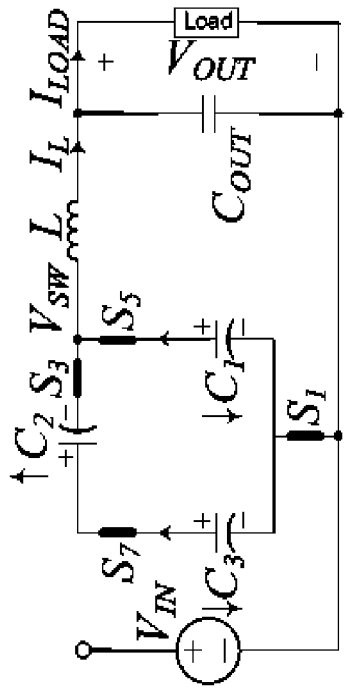
*Fig.2b*
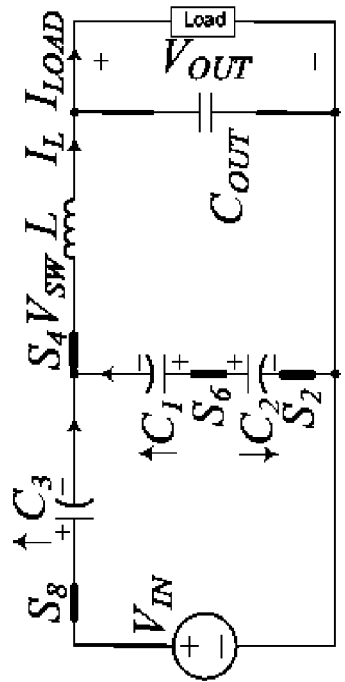
*Fig.2a*
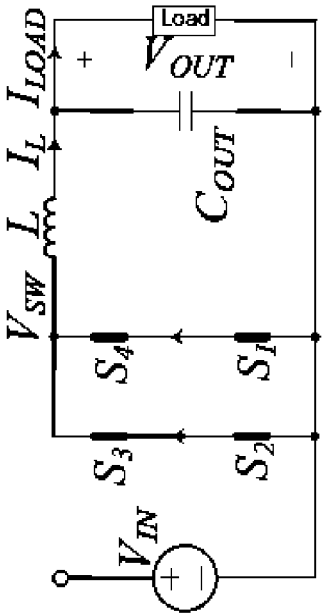
*Fig.2c*
| State/Switch | I | II | III |
|---|---|---|---|
| 1 | O | C | O |
| 2 | C | O | C |
| 3 | O | C | O |
| 4 | C | O | C |
| 5 | O | C | O |
| 6 | C | O | C |
| 7 | O | C | O |
| 8 | C | O | C |
*Fig.2d*

FAULT DETECTION IN HYBRID DC-DC POWER CONVERTORS

FIELD

This disclosure relates to fault detection in hybrid DC-DC power converters, and in particular to circuits and methods therefor.

BACKGROUND

An N-to-1 Dickson topology hybrid DC-DC power converter is a type of power converter having an input terminal for receiving an input voltage, a ground terminal and a switching node connected to a switched inductor. A switching cycle of such a power converter comprises three operating states, being: a first state in which a first set of capacitors is charged and a second set of capacitors is discharged such that in normal operation the switching node is at 1/Nth of the voltage of the input terminal; a second state in which the first set of capacitors is discharged and the second set of capacitors is charged such that, again, in normal operation the switching node is at 1/Nth of the voltage of the input terminal; and a third state in which the switching node is short-circuited to the ground terminal.

SUMMARY

According to a first aspect of the present disclosure there is provided a fault detection circuit for an N-to-1 Dickson topology hybrid DC-DC power converter having at least (N−1) level-setting capacitors, an input terminal for receiving an input voltage, a ground terminal, and a switching node connected to an inductor, and operational according to an operating cycle comprising first, second and third states; the fault detection circuit comprising: a first measuring circuit configured to measure a first voltage, Vsw1, at the switching node in the first state in which first and second sets of the level-setting capacitors are being respectively charged and discharged; a first calculation circuit configured to calculate a first absolute error voltage as an absolute difference of the first voltage in one operating cycle (Vsw1[n−1]) and in a next subsequent operating cycle (Vsw1[n]); a first fault circuit configured to provide a first fault output indicative of a fault in response to the first absolute error voltage exceeding a short-circuit-trip level; a second measuring circuit configured to measure a second voltage, Vsw2, at the switching node in the second state in which the first and second sets of the level-setting capacitors are being respectively discharged and charged; a second calculation circuit configured to calculate a second absolute error voltage as an absolute difference of the second voltage in one operating cycle (Vsw2[n−1]) and in a next subsequent operating cycle (Vsw2[n]); and a second fault circuit configured to provide a second fault output indicative of a fault in response to the second absolute error voltage exceeding the short-circuit-trip level.

Thus by measuring the voltage at a single point in the circuit (i.e. the switching node) at different moments of a complete switching cycle, short-circuit faults which develop in the converter may be detected. It will be appreciated that the voltages mentioned are relative to a ground voltage.

The fault detection circuit may further comprise: a third measuring circuit configured to measure the input voltage; a third calculation circuit configured to calculate a third absolute error voltage as the absolute value of: the sum of the first and the second voltage in one operating cycle minus 2/N times the input voltage; and a third fault detection circuit configured to provide a third fault output indicative of a fault in response to the second absolute error voltage exceeding an open-circuit-trip level. Thus the circuit may be simply and easily extended, measuring the voltages at as few as two points in the circuit at different moments of switching cycles in order to measure open-circuit faults as well as short-circuit faults.

In one or more embodiments the first, second and third calculation circuits, and the first, second and third fault circuits are digital circuits.

In one or more embodiments the circuit may further comprise a circuit providing a summary fault output in response to at least one of the first, second and third fault outputs being indicative of a fault. Thus there may be a generic fault indicator provided in addition to an indicator specifically identifying a short-circuit fault or an open-circuit fault.

In one or more embodiments, each of the first, second and third measuring circuits comprise an analog-to-digital converter. In such embodiments, most of the manipulation and calculation may be carried out in the digital domain.

In one or more embodiments, each of the first, second and third measuring circuits comprise the same analog-to-digital converter. This may substantially reduce the component count of the circuit, relative to embodiments in which two or even three analog-to-digital converters are used.

In one or more embodiments, each of the first, second, and third fault circuits comprises a comparator. In one or more such embodiments each of the first and second fault circuits comprises the same comparator. Utilising the same comparator for more than one function may reduce the component count, in the instance of the components being implemented as analogue components; in the alternative, wherein the functionality is carried out in the digital domain, reduced processing requirements may result.

In one or more embodiments the first, second and third calculation circuits, and the first, second and third fault circuits are analog circuits.

According to a second aspect of the present invention, there is provided a method for detecting a fault in a N-to-1 Dickson topology hybrid DC-DC power converter having an operating cycle and having at least (N−1) level-setting capacitors, an input terminal for receiving an input voltage, a ground terminal, and a switching node connected to an inductor; the method comprising: measuring a voltage at the switching node in first and second states in which first and second sets of level-setting capacitors are being, respectively, charged and discharged, and discharged and charged; calculating a first absolute error voltage as an absolute difference of the voltage at the switching node in the first state in an operating cycle and a next subsequent operating cycle; calculating a second absolute error voltage as an absolute difference of the voltage at the switching node in the second state in an operating cycle and a next subsequent operating cycle; comparing the sum of the voltages at the switching node in first and second states with one half the input voltage, to determine a third absolute error voltage; detecting a fault in response to either the third absolute error voltage exceeding a first trip voltage level, or either the first or second absolute error voltages exceeding a second trip voltage level.

In one or more embodiments of such a method, in the first state the first set of capacitors is charged and the second set of capacitors is discharged such that in normal operation the switching node is 1/Nth of the voltage of the input terminal; wherein in the second state the first set of capacitors is discharged and the second set of capacitors is charged such that in normal operation the switching node is at 1/Nth of the voltage of the input terminal, and in the third state the switching node is short-circuited to the ground terminal; and wherein a cycle of normal operation comprises operating successively in the first, third, second and third states.

In one or more embodiments calculating a first absolute error voltage as an absolute difference of the voltage at the switching node in the first state in an operating cycle and a next subsequent operating cycle comprises:
subtracting the respective switching node voltage in the first and second states in the (n−1)th cycle (Vsw1[n−1], Vsw2[n−1]) to determine a first and a second absolute errors (Vsc1,err, $V_{SW2,ERR}$), according to:

$$V_{SW1,ERR} = |V_{SW1}[n] - V_{SW1}[n-1]|, \text{ and}$$

$$V_{SW2,ERR} = |V_{SW2}[n] - V_{SW2}[n-1]|.$$

In one or more embodiments comparing the sum of the voltages at the switching node in first and second states with one half the input voltage, to determine a third absolute error voltage comprises:
summing the switching node voltage in the first and second states in the (n)th cycle to determine a sum value (Vsum[n]), according to $$(V\text{sum}[n] = V\text{sw1}[n] + V\text{sw2}[n]), \text{ and}$$

subtracting half the input voltage to determine a third absolute error (Vsum,err) according to:

$$V\text{sum},err = |V\text{sum}[n] - V_{IN}/2|.$$

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer-readable medium, which may be a physical computer-readable medium, such as a disc or a memory device, or may be embodied as another non-transient signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIG. 2a illustrates a first state (I) of operation of the power converter of FIG. 1;

FIG. 2b illustrates a second state (II) of operation of the power converter of FIG. 1;

FIG. 2c illustrates a third state (0) of operation of the power converter of FIG. 1;

FIG. 2d shows a truth table illustrating the status of each of 8 switches in the three operating states of the switching cycle of the power converter of FIG. 1;

Figure 1:
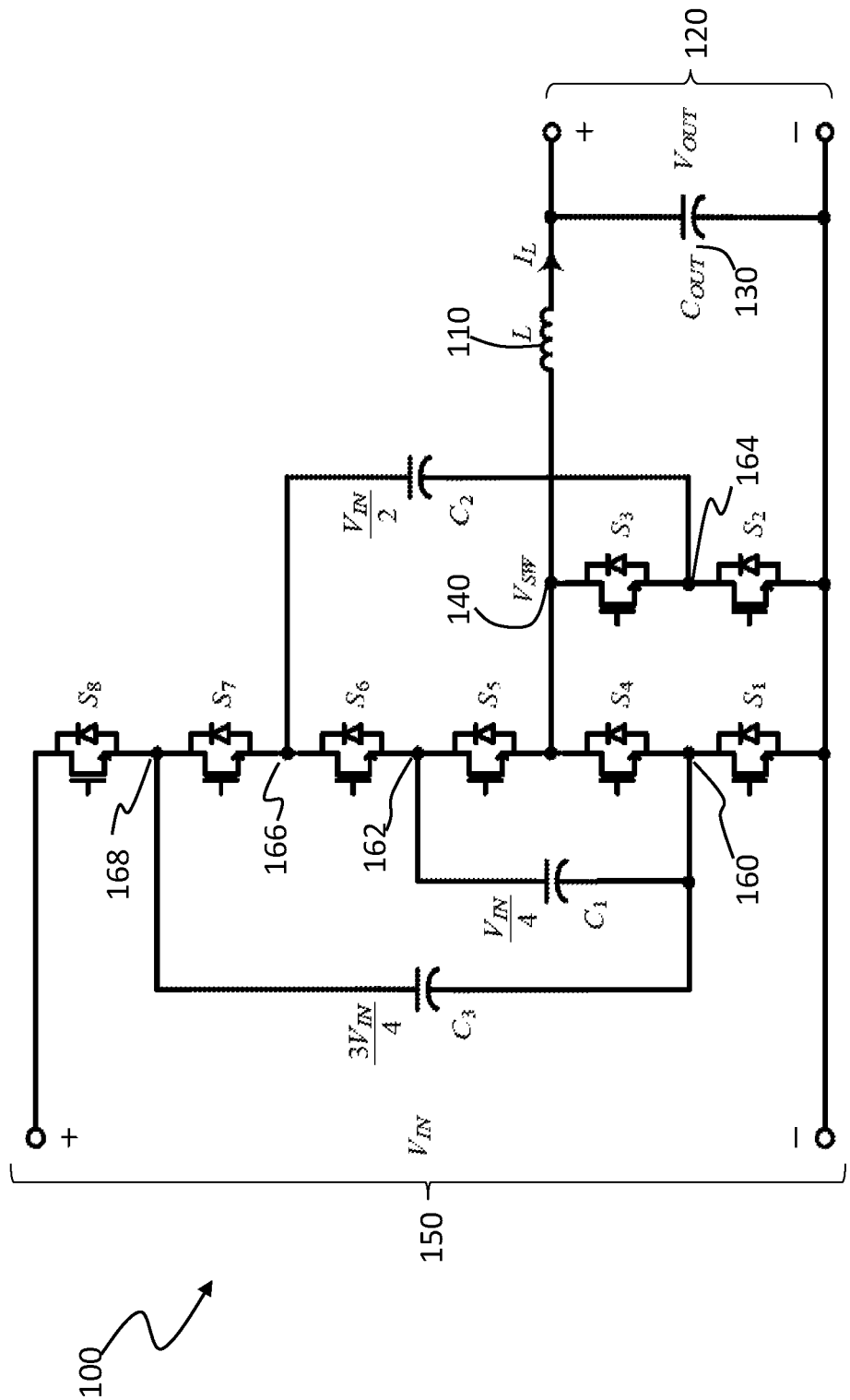
FIG. 1 illustrates a 4-to-1 Dickson topology hybrid DC-DC power converter.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 illustrates a 4-to-1 Dickson topology hybrid DC-DC power converter. This topology of power converter is an example of so-called hybrid topologies which include a switched capacitor stage, in combination with a regular inductive DC-DC converter. Hybrid topologies for DC-DC converters present a number of advantages regarding the implementation of fault-tolerant DC-DC converters. First of all, the use of more power switches than regular inductive DC-DC converters reduces the maximum voltage rating requirements of these power switches and increases converter efficiency, for instance by reducing switching losses through the reduced voltage swing of the switching node compare to a regular inductive DC-DC converter. Secondly, due to the fact that these multiple power switches are used in series, the affected part of the converter can be isolated by opening non-damaged switches in the power stage. On the other hand, the increased number of required components increases the complexity of the hardware/software subsystems required to detect faults on them.

The 4-to-1 Dickson typology hybrid DC-DC power converter illustrated in FIG. 1 is a specific example of the class of N-to-1 Dickson topology hybrid DC-DC-power converters, and will be used to illustrate the principles of the present disclosure. However, as will be discussed in more detail hereinbelow, the present disclosure is not limited to 4-to-1 ratio, but extends in general to N-to-1, where N is greater than or equal to 4. Examples with other stepdown ratios will be shown hereinbelow.

The 4-to-1 Dickson topology shown in FIG. 1 may be used for a step-down voltage conversion with high ratio $V_{IN}/V_{OUT}$ with fault tolerance. It has been demonstrated that this topology is able to achieve higher efficiency than other topologies (regular inductive buck, 3-level hybrid topology) with the same silicon area for a selected design case, in which a 48V supply is required to provided a 3V output voltage, and is therefore favourable for high-voltage-ratio conversion. The skilled person will appreciate that for other design cases, with different step-down voltage ratios of $V_{IN}:V_{OUT}$, different topologies (such as 3-to-1 or 5-to-1), may be preferred.

The converter 100 shown in FIG. 1 includes a switched inductor, L, 110, which provides an output voltage $V_{OUT}$, 120 at its output side and across an output capacitor Cout 130. The input side of the inductor 110 is connected to a switching node 140. The switching node 140 has a switching voltage $V_{SW}$ across it. The switching voltage $V_{SW}$ is arranged to be one quarter of the voltage $V_{IN}$ at input 150, due to the configuration and operation of a group of switches $S_1$ to $S_8$ and three capacitive elements $C_1$, $C_2$ and $C_3$. The skilled person will appreciate that each of the capacitive elements $C_1$, $C_2$ and $C_3$ may consist of a single capacitor, or a series and/or parallel combination of two or more capacitors.

Six of the switches, $S_1$, $S_4$, $S_5$, ... $S_8$ are arranged in series such that if all the switches were closed, the input voltage would be shorted. Counting from the ground up, a first capacitor $C_1$ is connected in parallel with the second and third of the series-connected switches ($S_4$ and $S_5$). That is to say it is connected between a node 160 joining the first and second of the series connected switches $S_1$ and $S_4$ and a node 162 between the third and fourth switches $S_5$ and $S_6$. As will be discussed in more detail below, this capacitor charges to one quarter of the input voltage $V_{IN}$.

The remaining two switches, $S_2$ and $S_3$ are connected in series with each other and in parallel with the first two switches (S1 and S4) of the series connected switches, again counting from the ground up. A second capacitor C2 is connected between the node 164 between the remaining two switches S2 and S3, and a node 166 between the fourth and fifth of the series connected switches $S_6$ and $S_7$. This capacitor charges to one half of the input voltage $V_{IN}$.

Finally, a third capacitor is connected between the node 160 between the first and second switches of the series connected switches, and a node 168 between the fifth and sixth of the series connected switches $S_7$ and $S_8$. This capacitor charges to three-quarters of the input voltage $V_{IN}$.

In order to understand the charging of the capacitors, and the resulting voltage at the switching voltage $V_{SW}$, the operating cycle of the converter will now be described. In particular, the operating cycle has first, second and third states. These are depicted in FIGS. 2a, FIG. 2b and FIG. 2c respectively.

In the first state (also referred to as "state I"), the switches $S_2$, $S_4$, $S_6$ and $S_8$ are closed, whereas the switches $S_1$, $S_3$, $S_5$, and $S_7$ are open, as shown in FIG. 2a. The voltage across the input is thus across $C_1$ in anti-series with $C_3$ and in anti-series with $C_2$. Due to the way in which they are connected and in relation to the direction of the inductor current $I_L$, capacitors $C_3$ and $C_1$ get charged while capacitor $C_2$ discharges. In steady state, the voltage $V_{SW}$ at the switching node 140 is equal to $V_{IN}/4$.

In the second state (also referred to as "state II"), the switches $S_1$, $S_3$, $S_5$ and $S_7$ are closed, whereas the switches $S_2$, $S_4$, $S_6$, and $S_8$ are open, as shown in FIG. 2b. The input $V_{IN}$ is thereby disconnected, and capacitor $C_3$ is arranged in parallel with an anti-series combination of $C_1$ and $C_2$. As a result, due to the direction of the inductor current $I_L$, capacitors $C_3$ and $C_1$ are discharged while capacitor $C_2$ charges. The voltage at $V_{SW}$ is equal to $V_{IN}/4$.

In the third state (also referred to as "state 0"), switches $S_1$, $S_2$, $S_3$ and $S_4$ are closed, whereas switches $S_5$, $S_6$, $S_7$ and $S_8$ are open. In consequence the switching node is short-circuited to ground. Thus, $V_{SW}=0V$.

The Open/Closed status of each of the eight switches (either open—O, or closed—C) for each of the three operating states, state II, state II and state 0 of the switching cycle are listed in FIG. 2d.

Figure 3:
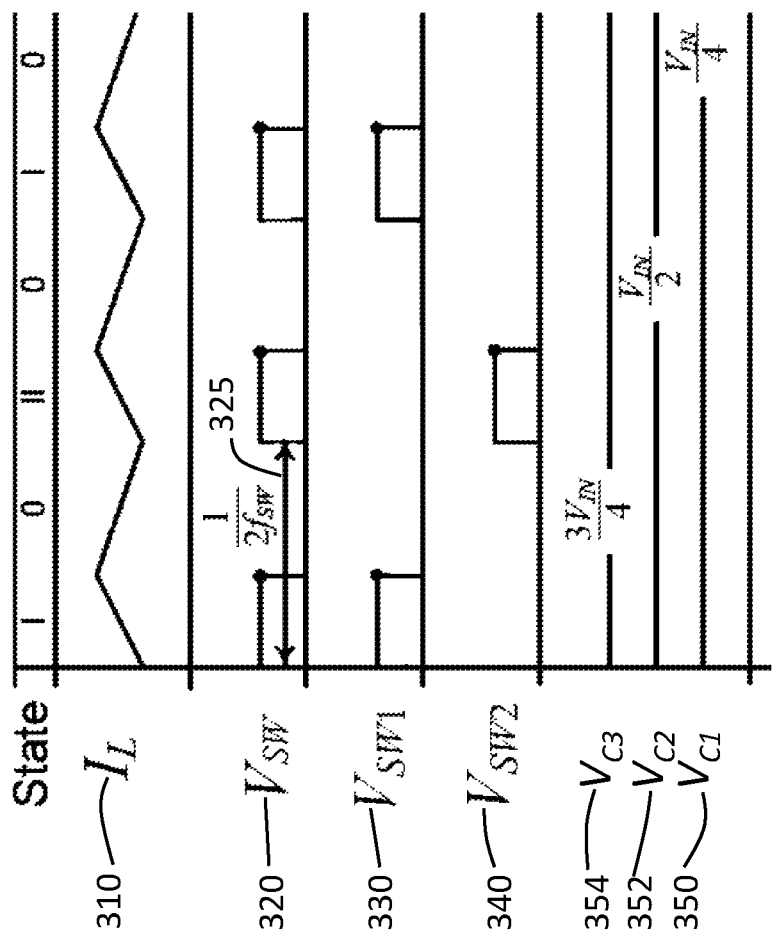
FIG. 3 shows the output current, the switching node voltage, and the voltage across each of three capacitors, for a power converter of FIG. 1 in normal operation.

During a complete switching period (cycle), the operation transitions through State I→State 0→State II→State 0. That is to say, the switching period consists of operation in a sequence of the first, third, second and third state. This is illustrated in FIG. 3. FIG. 3 shows, at 310, the inductor current $I_L$ during each of the three states. In both the first and second state the voltage $V_{SW}$ at the switching node 140, is $V_{IN}/4$, and in the third state ("State 0") the voltage is zero or ground, as shown at 320. The inductor current 310 rises during the first and second state, and falls during the third state.

This results in a square waveform of $V_{SW}$ at having a period $1/(2f_{SW})$ 325 of twice the cycling frequency with voltage levels equal to $V_{IN}/4$ and 0. Because the voltage swing at the switching node is reduced compared to a regular inductive power converter, the duty cycle is not as extremely low, which makes this topology particularly suited for high-voltage-ratio down conversion.

Since the voltage $V_{SW}$ at the switching node derives from a different capacitor and switch arrangement in the first state relative to the second state, these voltages are shown separately for the first state $V_{SW1}$ and the second state $V_{SW2}$, at 330 and 340 for completeness.

Finally, FIG. 3 shows, at 350, 352 and 354 respectively the voltages across each of the capacitors $C_1$, $C_2$ and $C_3$ in steady-state which, as already mentioned, are equal to $V_{IN}/4$, $V_{IN}/2$ and $V_{IN}/4$, respectively.

Figure 4:
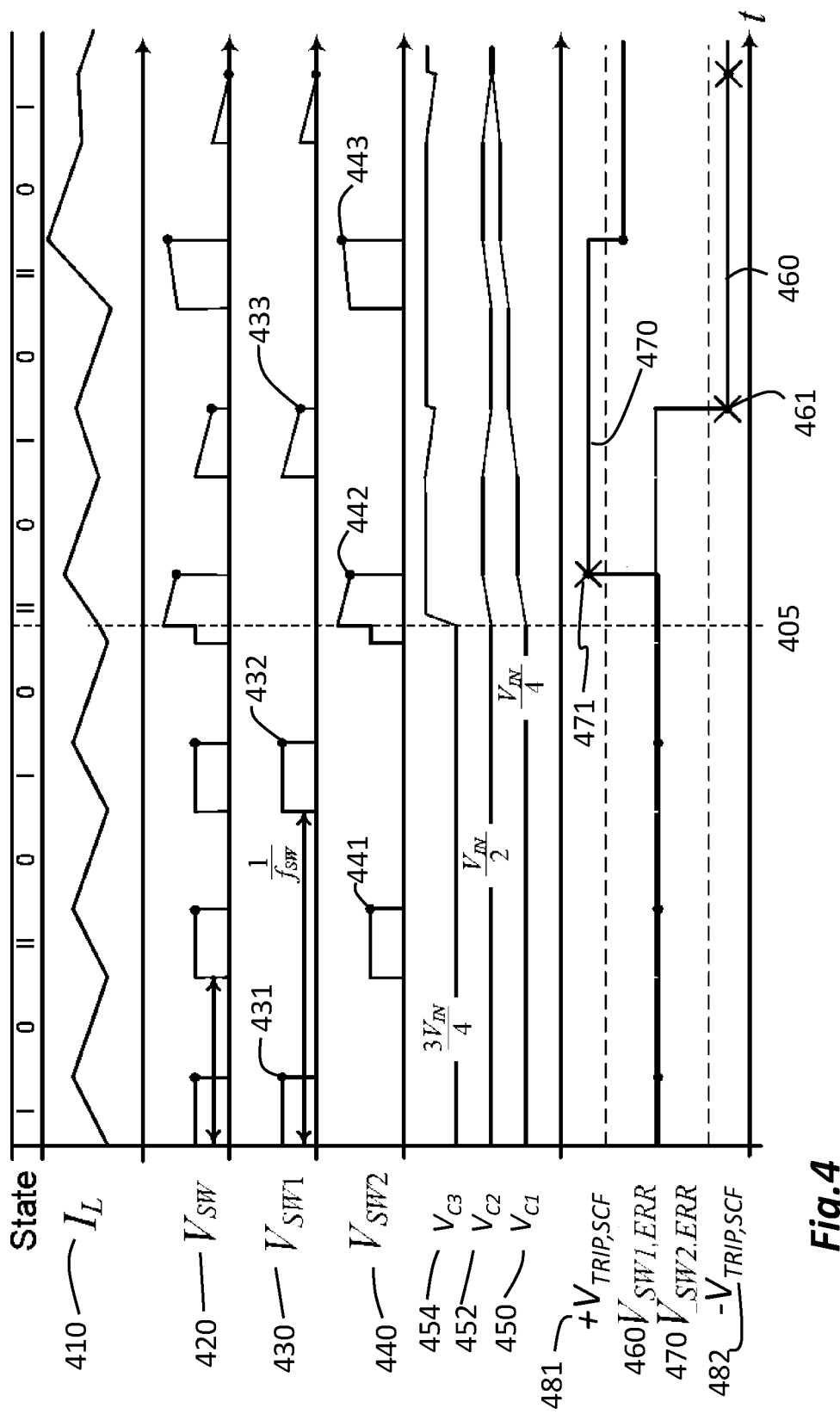
FIG. 4 shows the values of various signals for a power converter of FIG. 1 which incurs a short-circuit fault.

FIG. 4 illustrates a short-circuit fault (SCF) detection method in a 4 to 1 Dickson topology hybrid DC-DC converter, according to one or more embodiments. FIG. 4 shows the same information as that in FIG. 3—that is to say the inductor current IL, at 410, the voltage $V_{SW}$ at the switching node at 420, and that voltage separated out for the first state ($V_{SW1}$) at 430 and the second state ($V_{SW2}$) at 440, along with the voltages across each of the three capacitors C1, C2 and C3 at 450, 452, and 454. The figure also shows the values of two calculated derived error voltages ($V_{SW1,ERR}$ and $V_{SW2,ERR}$), as will be discussed in more detail hereinbelow.

Towards the left-hand side of the figure is illustrated normal operation. At a moment 405, shown by the dashed line in FIG. 4, an SCF is simulated in one of the switches—in this example switch S8. In this example, the converter is operating in the second state (State II) of the operating cycle. Normally in this state, switch S8 is open so the short-circuit failure of switch S8, results in an immediate different topology of the capacitors. In consequence the voltage balance is affected and there is a rapid rise in the voltage $V_{SW}$ of the switching node.

To detect such an SCF according to one or more embodiments, the following methodology is used:

First, the switching node voltage $V_{SW}$ is sampled at every switching period during the first and the second states—that is to say State I (Vsw1[n]) and State II (Vsw2[n]). In FIG. 4 these sampling points are shown by the round dots towards the end of each of the times when the switching node is at $V_{IN}/4$.

Second, these 2 values are compared with their corresponding values in the previous sampling period ($V_{SW1}[n-1]$ and $V_{SW2}[n-1]$). In normal operation, these voltages are nearly constant as illustrated by the correspondence of the voltage measured at the first state $V_{SW1}$ at 431 and 432. However, in the case that a fault develops, these voltages will change, as illustrated by the voltage during the second state during normal operation shown at 441 compared with the voltage after the development of the SCF, at 442.

The absolute value of the difference between 2 consecutive samples of the same State is computed as $V_{SW1,ERR}$ or $V_{SW2,ERR}$:

That is to say, $$V_{SW1,ERR}=|V_{SW1}[n]-V_{SW1}[n-1]|, \text{ and}$$

$$V_{SW2,ERR}=|V_{SW2}[n]-V_{SW2}[n-1]|.$$

During normal operation this error value is low, being at or close to 0.

Third, if the difference is larger than a particular absolute error magnitude $V_{TRIP,SCF}$, a fault is signalled, since when a fault occurs, this error value becomes non-zero. FIG. 4 shows the respective error signals for the state I and state II at 460 and 470, along with positive and negative values of the year error threshold+$V_{TRIP,SCF}$ and $V_{TRIP,SCF}$ respectively at 481 and 482. In the particular example shown in FIG. 4, the SCF occurs during state II of the operating cycle, and before the sampling of state II. Thus the state II error signal exceeds the trip or threshold level, shown at 471, before the state I error signal exceeds the trip or threshold level, shown at 461. The magnitude of error threshold $V_{TRIP,SCF}$ may be selected based on the expected dynamics of the voltage transients at the switching node. This in turn will generally depend on the design parameters of the power converter itself, in order to ensure rapid fault detection whilst still providing robustness towards expected transient variations during the operating modes in normal operation.

It will be appreciated that as an alternative to determining the absolute value of the difference between 2 consecutive samples of the same State, a simple difference may be determined, and this compared with a threshold or trigger level.

In the example shown in FIG. 4, the sampling of the switching node voltage $V_{SW}$ occurs just prior to the end of state I and state II in order to avoid or reduce any switching noise that may otherwise disturb the voltage value.

As can be seen in FIG. 4, methods according to the present disclosure may allow for robust detection of a SCF in less than a single switching period of the power converter. Such rapid detection can significantly enhance the opportunity to contain the fault and avoid or prevent its propagation, before other parts of the system are affected are impacted by the fault.

Figure 5:
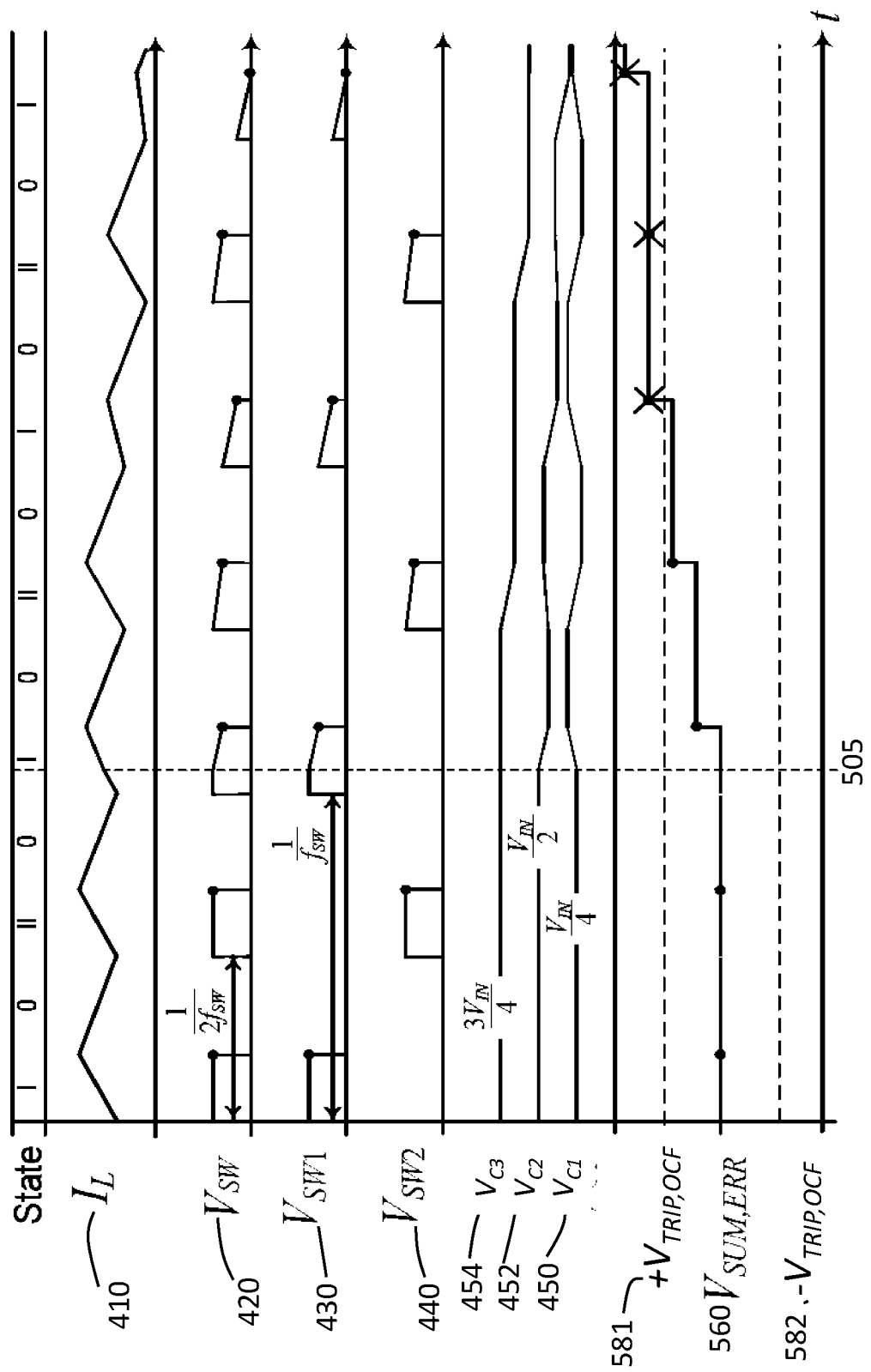
FIG. 5 shows the values of various signals for a power converter of FIG. 1 which incurs an open-circuit fault.

FIG. 5 shows various signals, in order to illustrate how the above methods may be adapted and, or in the alternative, modified or refined in order to effectively detect open-circuit faults (OCF). Typically open-circuit faults show a slower change or deviation of the voltage levels at the switching node. Thus for proper detection of open-circuit faults, modifications to the method described above with respect to FIG. 4 may be appropriate.

Consider again that, in normal operation, the sum of the voltages levels of the switching nodes during state I and state II (respectively $V_{IN}/4$ and $V_{IN}/4$) is equal to the voltage across the capacitor C2 ($V_{IN}/2$). Furthermore, the voltage across the capacitor C2 is always equal, or very close, to $V_{IN}/2$ even during transients—such as when the converter adapts to a change in the load—provided that the transients are not faster than the switching frequency of the converter. In normal operation it would not be expected that transients would be faster than the switching frequency of the converter. This feature may be used to manipulate the values measured at the switching node to detect OCF events in addition to or as an alternative to the above-mentioned detection of SCF events:

In essence, an OCF in any of the power switches or floating—that is to say, level-setting—capacitors may be detected by:

First, the switching node voltage $V_{SW}$ is sampled at every switching period during State I ($V_{SW1}[n]$) and State II ($V_{SW2}[n]$), as described above.

Second, these two values are added at every sampling period into a $V_{SUM}[n]$ value=($V_{SUM}[n]=V_{SW1}[n]+V_{SW2}[n]$).

Third, the absolute value of the difference between Vsum[n] and half of the input voltage ($V_{IN}$) is calculated, that is to say:

$$V_{SUM,ERR}=|V_{SUM}[n]-V_{IN}/2|.$$

And finally if this difference is larger than a particular error magnitude $V_{TRIP,OCF}$ a fault may be signalled.

As discussed above with respect to the threshold for the short-circuit faults, the magnitude of the threshold $V_{TRIP,OCF}$ may be optimally selected based on the design parameters of the power converter. This may enable adequately fast detection of a fault, whilst still providing adequate robustness towards transient variations of the operating modes which may be expected due to normal operation, for instance due to variation of the load, as mentioned above. It should be noted that typically severity of open-circuit faults is lower than that of short-circuit faults, and thus a slower reaction in general may be acceptable for normal applications.

Again, it will be appreciated that as an alternative to determining the absolute value of the difference between Vsum[n] and half of the input voltage, a simple difference may be determined, and this compared with a threshold or trigger level.

Turning to the detail of FIG. 5, the figure shows the same signals as for FIG. 4, except that in this case, the error signal $V_{SUM,ERR}$ is shown at 560, and the positive and negative going threshold values for that error signal, respectively, +$V_{TRIP,OCF}$ and −$V_{TRIP,OCF}$, are shown at 581 and 582. At a moment 505, shown by the dashed line in FIG. 5, an OCF is simulated in one of the switches—in this example switch S8. It can be seen, that as shown in FIG. 5, more than one complete switching cycle may be required before the absolute value of $V_{SUM,ERR}$ exceeds the threshold level+$V_{TRIP,OCF}$ In the example of FIG. 5, the detection of the fault occurs within two switching cycles—which will in general still be sufficiently rapid to enable protection of the complete system.

Figure 6:
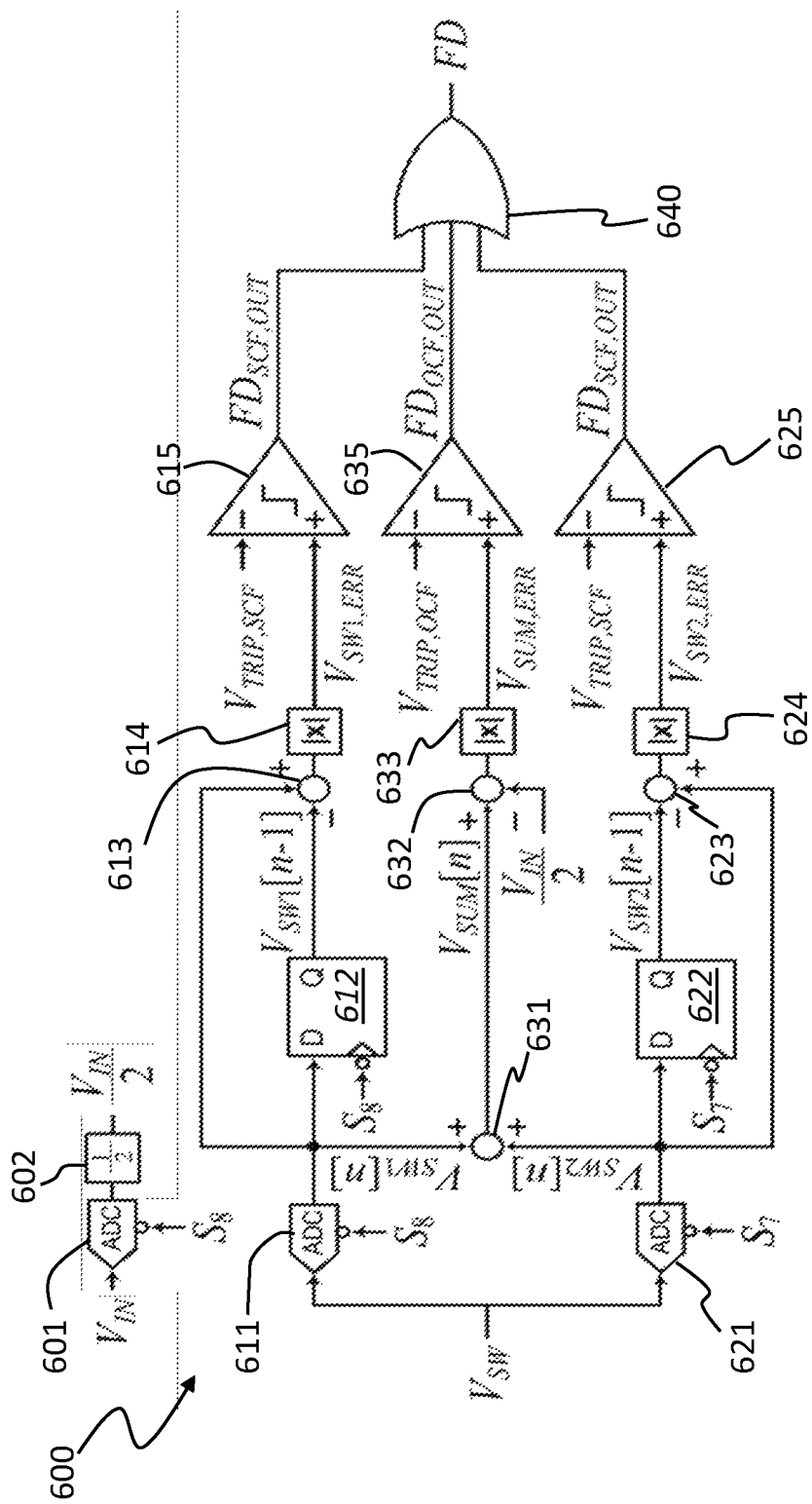
FIG. 6 shows, conceptually, a circuit according to embodiments of the present disclosure.

A conceptual circuit arrangement 600 to carry out the methods just described for detection of one or both of SCFs and OCFs is shown in FIG. 6. The circuit includes three analog-to-digital converters (ADC) 601, 611 and 621. ADC 601 samples the voltage across $V_{IN}$ once every switching cycle (in this example this is done when SW8 is closed, since this occurs once per switching cycle, although in other embodiments the sampling of $V_{IN}$ may be made at different times are triggered by other different timing events). This value of Vin is halved at 602 to determine the value $V_{IN}/2$ (which is required for open-circuit fault detection as discussed below).

ADC 611 is triggered to sample the voltage at the switching node $V_{SW}$, again once every switching cycle—in this instance this is determined by $SW_8$ being closed so the converter is in state II, although in other embodiments different switches (for instance, $SW_2$, $SW_4$ or $SW_6$) may be used as the trigger event.

Similarly, ADC 621 is triggered to sample the voltage at the switching node $V_{SW}$, again once every switching cycle—in this instance this is determined by SW7 being closed so the converter is in state I, although in other embodiments different switches (for instance, $SW_1$, $SW_3$ or $SW_5$) may be used as the trigger event.

Each of these values, for the nth switching cycle (that is to say, $V_{SW1}[n]$ and $V_{SW2}[n]$) is used both in the determination of SCF and OCF.

For the determination of a SCF, the value $V_{SW1}[n]$ is stored in memory element 612, which may be, for instance, a flipflop, and is subtracted from the previous value $V_{SW1}$ [n−1] at logic 613. The absolute value of the signal is determined, shown as at 614, to determine the error signal $V_{SW1,ERR}$. This is compared with the threshold level $V_{TRIP,SCF}$ in comparator 615, which may be implemented, as shown, as a Schmitt trigger, to result in a first short-circuit fault detection signal $FD_{SCF,OUT}$. Correspondingly, the value $V_{SW2}$[n] is stored in memory element 622, and is subtracted from the previous value $V_{SW2}$[n−1] at logic 623. The absolute value of the signal is determined, shown as at 624, to determine the error signal $V_{SW1,ERR}$. This is compared with the threshold level or short-circuit-trip level, $V_{TRIP,SCF}$ at comparator 625, which may, as shown, be implemented as a Schmitt trigger to result in a second short-circuit fault detection signal $FD_{SCF,OUT}$.

For the determination of an OCF, the values $V_{SW1}$[n] and $V_{SW2}$[n] are summed, as shown in 631 and the value $V_{IN}/2$ is subtracted as shown at 632. The absolute value is determined at 633, to provide the signal $V_{SUM,ERR}$. This is compared with the threshold level, or open-circuit-trip level, $V_{TRIP,OCF}$ at comparator 635, which may as shown be implemented as a Schmitt trigger to result in an open-circuit fault detection signal $FD_{OCF,OUT}$.

Finally, the two short-circuit detection fault detection signals $FD_{SCF,OUT}$ and the open-circuit fault detection signal $FD_{OCF,OUT}$ are combined in logic 640 to provide a generic fault detection signal FD.

It will be appreciated, that the above conceptual circuit may be implemented in many different ways. In particular, although separate ADCs 601, 611 and 621 have been shown, the same ADC may be utilised to sample the switching voltage $V_{SW}$ at different times to put into effect requirements of 611 and 621, and the same ADC may further be used to measure the voltage $V_{IN}$ at a separate moment in the switching cycle. Thus three ADCs may not be required; either one or two may be used instead.

Similarly, three comparators 615, 625 and 635 are shown but the skilled person will appreciate that the same circuit elements or digital processing block may be used to carry out two or more of these functions.

Furthermore, in FIG. 6 analog-to-digital converters are used to convert the analog values of the switching voltage $V_{SW}$ and the input voltage $V_{IN}$, into the digital domain. In one or more other implementations, these values may be sampled by an analog technique and one or more of the subsequent summing, subtraction, or comparison functions may be implemented by analog circuits with which the skilled person will be familiar. Furthermore, the skilled person will appreciate that it is possible to implement the circuit in a mixed signal solution with a combination of analog and digital circuit elements.

The description above has focused on a 4-to-1 Dickson topology hybrid DC-DC power converter. However, as already mentioned, the present disclosure extends to Dickson topology converters with other step-down ratios, in general N-to-1.

Figure 7:
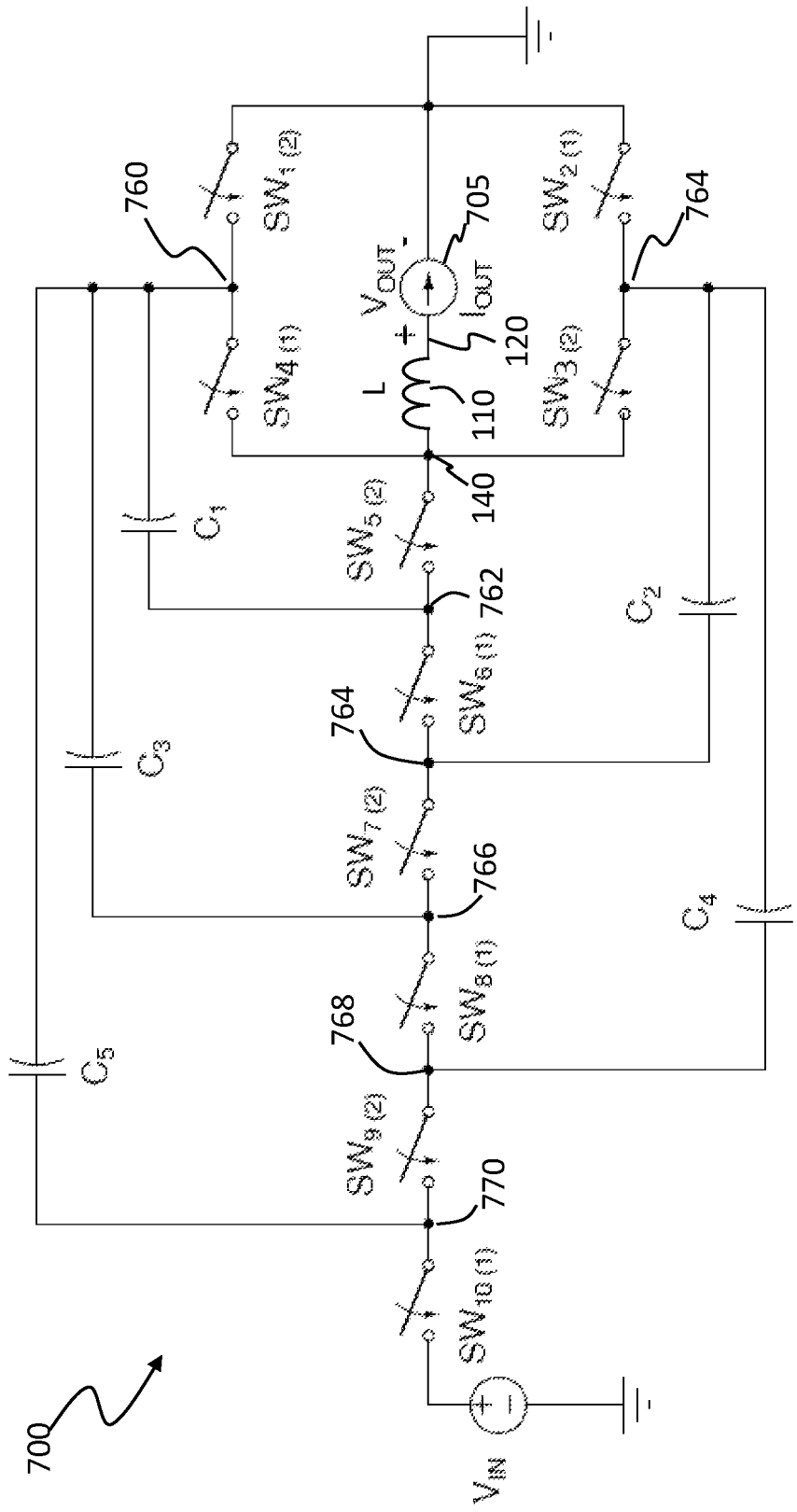
FIG. 7 illustrates a 6-to-1 Dickson topology hybrid DC-DC power converter.

FIG. 7 illustrates a 6-to-1 Dickson topology hybrid DC-DC power converter. In common with the 4-to-1 converter illustrated in FIG. 1, the converter 700 includes a switched inductor, L, 110, which provides an output voltage $V_{OUT}$, 120 at its output side, to power a load, shown here at 705 (in this instance, an output capacitor Cout is not shown). The input side of the inductor 110 is connected to a switching node 140.

In the 6-to-1 topology shown, N is equal to 6; there are a total of 10 switches, $SW_1$, $SW_2$ ... $SW_{10}$—that is to say, 4+N. Further, there are 5 floating, or level-setting, capacitors, $C_1, C_2 \ldots C_5$. That is to say there are (N−1) capacitors. The capacitors form a sort of modified ladder, in which one terminal of each of the successive capacitors is connected to a node at a separate "rung" of the ladder, 762, 764 ... 770 respectively—(the reader may find it instructive to compare these with nodes 162, 166 and 168 of the 4-to-1 convertor shown in FIG. 1). The other terminal of each of the "odd" numbered capacitors $C_1$, $C_3$ and $C_5$, is connected to a further node 760, and the other terminal of each of the "even" numbered capacitors, $C_2$ and $C_4$ is connected to a yet further node 740.

Each of the further node and the yet further node can be switched between the switching node $V_{SW}$ 140 and ground. In the first state of the operating cycle, State I, the odd capacitors are charged (by switching node 760 to ground), whilst of the even capacitors are discharged (node 764 is switched to the switching node $V_{SW}$ 140). Conversely, in the first state of the operating cycle, State II, the odd capacitors are discharged (by switching node 760 to the switching node $V_{SW}$ 140), whilst of the even capacitors are charged (node 764 is switched to ground). In the third state, state, the switching node is grounded (by closing at least one of the pairs of switches $SW_4$ and $SW_1$, and $SW_3$ and $SW_2$). Thus in this case, the odd capacitors $C_1$, $C_3$ and $C_5$ form a first set of capacitors which are charged during the first state, State I, and discharged during the second state, State II. The even capacitors $C_2$, and $C_4$ form a second set of capacitors which are discharged during the first state, State I, and charged during the second state, State II.

In the figure, it is indicated for each of the switches, those which are closed in State I and State II, by the addition of a second subscript: that is to say the even switches $SW_6$, $SW_8$ and $SW_{10}$ are closed in State I, indicated by $SW_{6\,(1)}$, $SW_{8\,(1)}$ and $SW_{10\,(1)}$, and the odd switches $SW_5$, $SW_7$ and $SW_9$ are closed in State II, indicated by $SW_{5\,(2)}$, $SW_{7\,(2)}$ and $SW_{9\,(2)}$. Similarly, the open/closed state of the four switches which control the nodes 760 and 764 are shown ($SW_{1\,(2)}$, $SW_{2\,(1)}$, $SW_{3\,(2)}$ and $SW_{4\,(1)}$.

Short-circuit faults are detected as described above for the 4-to-1 case; open circuit faults are detected by comparing the sum of the voltages $V_{SW}$ at the switching node during the first and second state, with $2V_{IN}/6$, that is to say, $V_{IN}/3$. In other words, the average voltage at switching node 140 during these two states, is compared with the expected step-down ratio $V_{IN}/6$.

Figure 8:
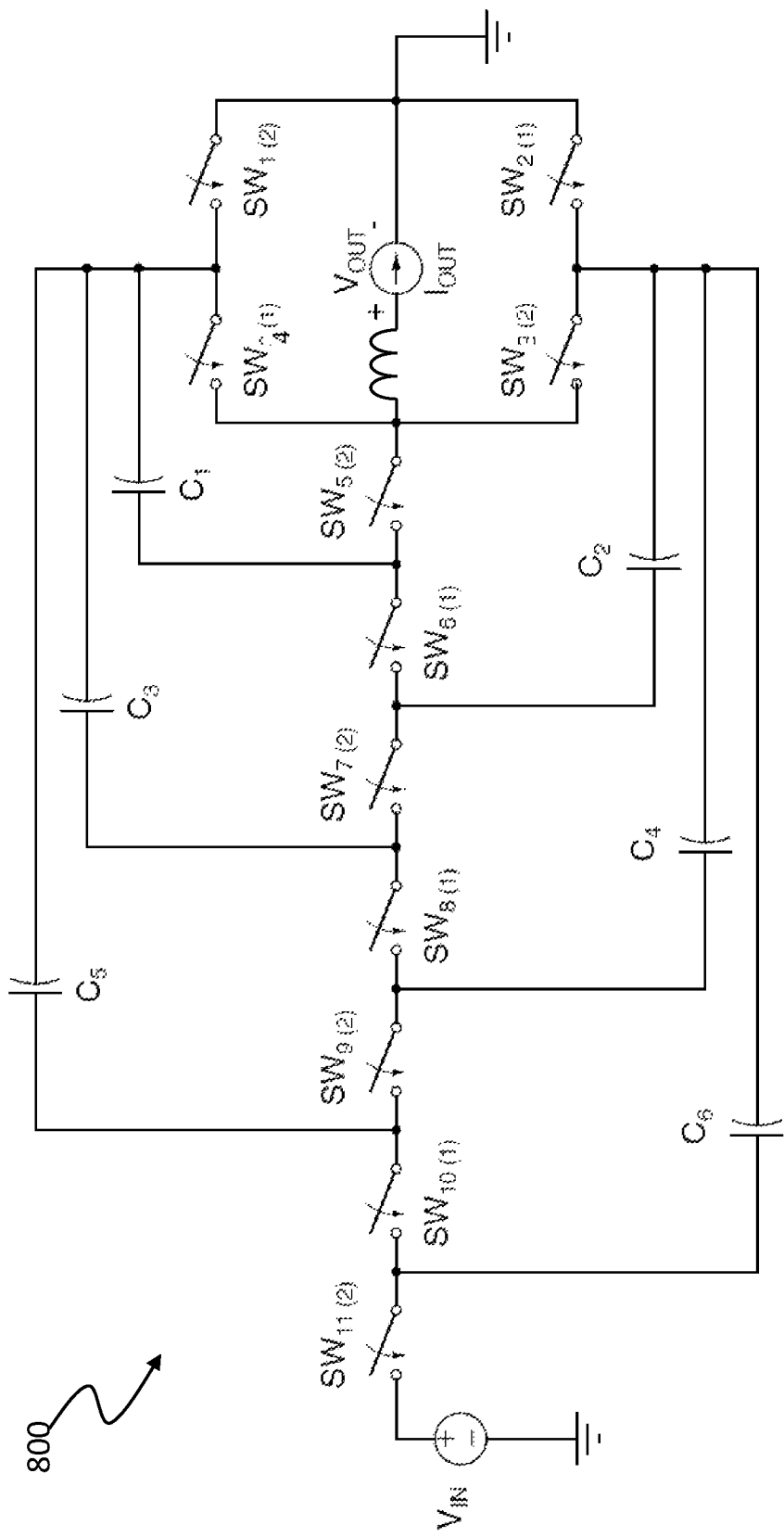
FIG. 8 illustrates a 7-to-1 Dickson topology hybrid DC-DC power converter.

FIG. 8 illustrates a 7-to-1 Dickson topology hybrid DC-DC power converter. In this case there are 11 (that is to say 4+7) switches, and 6 (that is to say 7-1) floating or level setting capacitors. Again, the odd capacitors $C_1$, $C_3$ and $C_5$ form the first set of capacitors which are charged during the first state, State I, and discharged during the second state, State II. The even capacitors $C_2$, $C_4$ and $C_6$ form the second set of capacitors which are discharged during the first state, State I, and charged during the second state, State II.

Once again, short-circuit faults are detected as described above for the 4-to-1 case; open circuit faults are detected by comparing the sum of the voltages $V_{SW}$ at the switching node during the first and second state, with $2V_{IN}/7$. In other words, the average voltage at switching node 140 during these two states is compared with the expected step-down ratio $V_{IN}/7$.

The skilled person will immediately appreciate that for the general case, the schematics circuit shown in FIG. 6 will be modified by replacing the divide-by-two logic 602 (that is to say, "divide by 4/2" which is used for the 4-to-1 step-down ratio), by a "divide by N/2" logic. This value ($2V_{IN}/N$) is then used in the difference stage 632.

From reading the present disclosure, other variations and modifications will be apparent to the skilled person. Such variations and modifications may involve equivalent and other features which are already known in the art of hybrid power converters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

LIST OF REFERENCE SIGNS 100 4-to-1 Dickson topology hybrid DC-DC power converter
110 switched inductor, L
120 output voltage, $V_{OUT}$
130 output capacitor, $C_{OUT}$
140 switching node
150 input voltage $V_{IN}$
160 node between first ($S_1$) and second ($S_4$) series connected switches
162 node between third ($S_5$) and fourth ($S_6$) series connected switches
164 node between remaining switches ($S_2$ and $S_3$)
166 node between fourth ($S_6$) and fifth ($S_7$) series connected switches
168 node between fifth ($S_7$) and sixth ($S_8$) series connected switches
310 inductor current, IL
320 switching node voltage $V_{SW}$
330 switching node voltage in state I, $V_{SW1}$
340 switching node voltage in state II, $V_{SW2}$
350 voltage across $C_1$
352 voltage across $C_2$
354 voltage across $C_3$
405 moment of simulated fault
410 inductor current, IL
420 switching node voltage $V_{SW}$
430 switching node voltage in state I, $V_{SW1}$
440 switching node voltage in state II, $V_{SW2}$
450 voltage across $C_1$
452 voltage across $C_2$
454 voltage across $C_3$
460 error signal $V_{SW1,SCF}$
461 error signal $V_{SW1,SCF}$ change moment
470 error signal $V_{SW2,SCF}$
471 error signal $V_{SW2,SCF}$ change moment
481 short-circuit-trip positive level $V_{TRIP,OCF}$
482 short-circuit-trip negative level $V_{TRIP,SCF}$
560 error signal $V_{SW1,OCF}$
581 open-circuit-trip positive level $V_{TRIP,OCF}$
582 open-circuit-trip negative level $V_{TRIP,OCF}$
600 conceptual fault-detection circuit
601 ADC
602 Divide-by-2 logic
611 ADC
612 memory element
613 difference logic
614 absolute value logic
615 comparator
621 ADC
622 memory element
623 difference logic
624 absolute value logic
625 comparator
631 summing logic
632 difference logic
633 absolute-value logic
635 comparator
640 OR LOGIC
700 6-1 Dickson topology hybrid DC-DC power converter
705 Load
760, 764 charge/discharge nodes
762, 766 . . . 770 ladder nodes
800 7-1 Dickson topology hybrid DC-DC power converter

The invention claimed is:

1. A fault detection circuit for a N-to-1 Dickson topology hybrid DC-DC power converter having at least (N−1) level-setting capacitors, an input terminal for receiving an input voltage, a ground terminal, and a switching node connected to an inductor, and operational according to an operating cycle comprising first, second and third states;

the fault detection circuit comprising:
a first measuring circuit configured to measure a first voltage, VSW1, at the switching node in the first state in which first and second sets of the level-setting capacitors are being charged and discharged;
a first calculation circuit configured to calculate a first error voltage as a difference of the first voltage in one operating cycle (VSW1[n−1]) and in a next subsequent operating cycle (VSW1 [n]);
a first fault circuit configured to provide a first fault output indicative of a fault in response to an absolute value of the first error voltage exceeding a short-circuit-trip level;
a second measuring circuit configured to measure a second voltage, VSW2, at the switching node in the second state in which the first and second sets of the level-setting capacitors are being respectively discharged and charged;
a second calculation circuit configured to calculate a second error voltage as a difference of the second voltage in one operating cycle (VSW2[n−1] and in a next subsequent operating cycle (VSW2[n]); and
a second fault circuit configured to provide a second fault output indicative of a fault in response to an absolute value of the second error voltage exceeding the short-circuit-trip level.

2. The fault detection circuit as claimed in claim 1, wherein the first and second calculation circuits, and the first and second fault circuits are digital circuits.

3. The fault detection circuit as claimed in claim 1, further comprising:

a third measuring circuit configured to measure the input voltage;

a third calculation circuit configured to calculate a third error voltage as the value of: the sum of the first and the second voltage in one operating cycle minus 2/N times the input voltage; and a third fault detection circuit configured to provide a third fault output indicative of a fault in response to an absolute value of the second error voltage exceeding an open-circuit-trip level.

4. The fault detection circuit as claimed in claim 3, wherein the first, second and third calculation circuits, and the first, second and third fault circuits are digital circuits.

5. The fault detection circuit as claimed in claim 4, further comprising a circuit providing a summary fault output in response to at least one of the first, second and third fault outputs being indicative of a fault.

6. The fault detection circuit as claimed in claim 4, wherein each of the first, second and third measuring circuits comprise an analog-to-digital converter.

7. The fault detection circuit as claimed in claim 4, wherein each of the first, second and third measuring circuits comprise the same analog-to-digital converter.

8. The fault detection circuit as claimed in claim 4, wherein each of the first, second, and third fault detection circuits comprises a comparator.

9. The fault detection circuit as claimed in claim 8, wherein each of the first and second fault detection circuits comprises the same comparator.

10. The fault detection circuit as claimed in claim 1, wherein the first, second and third calculation circuits, and the first, second and third fault circuits are analog circuits.

11. The fault detection circuit as claimed in claim 1, wherein N=4, the first set of level-setting capacitors comprises a first capacitor and a third capacitor, and the second set of level-setting capacitors comprises a second capacitor.

12. A method for programming a fault detection circuit to detect a fault in a N-to-1 Dickson topology hybrid DC-DC power converter having an operating cycle and having at least (N−1) level-setting capacitors, an input terminal for receiving an input voltage, a ground terminal, and a switching node connected to an inductor; the method comprising configuring the fault detection circuit for:

measuring a voltage at the switching node in first and second states in which first and second sets of level-setting capacitors are being charged and discharged, and discharged and charged, respectively;

calculating a first error voltage, using a first calculation circuit, as a difference of the voltage at the switching node in the first state in an operating cycle and a next subsequent operating cycle;

calculating a second error voltage, using a second calculation circuit, as a difference of the voltage at the switching node in the second state in an operating cycle and a next subsequent operating cycle;

comparing the sum of the voltages, using a third calculation circuit, at the switching node in first and second states with 2/N times the input voltage, to determine a third error voltage;

detecting a fault in response to either an absolute value of the third error voltage exceeding a first trip voltage level, or an absolute value of either the first or second error voltages exceeding a second trip voltage level.

13. The method of claim 12,
wherein in the first state a first set of capacitors is charged and a second set of capacitors is discharged such that in normal operation the switching node is 1/N times the voltage of the input terminal; wherein in the second state the first set of capacitors is discharged and the second set of capacitors is charged such that in normal operation the switching node is quarter 1/N times the voltage of the input terminal, and in the third state the switching node is short-circuited to the ground terminal; and wherein a cycle of normal operation comprises operating successively in the first, third, second and third states.

14. The method of claim 12,
wherein calculating a first absolute error voltage as an absolute difference of the voltage at the switching node in the first state in an operating cycle and a next subsequent operating cycle comprises:

subtracting the respective switching node voltage in the first and second states in the (n−1)th cycle (VSW1 [n−1], VSW2[n−1]) to determine a first and a second absolute errors (Vsc1,err, VSW2,ERR), according to:

$$VSW1,ERR = |VSW1[n] - VSW1[n-1]|, \text{ and}$$

$$VSW2,ERR = |VSW2[n] - VSW2[n-1]|.$$

15. The method of claim 12,
wherein comparing the sum of the voltages at the switching node in first and second states with 2/N times the input voltage, to determine a third absolute error voltage comprises:

summing the switching node voltage in the first and second states in the (n)th cycle to determine a sum value (Vsum[n]), according to $$(V\text{SUM}[n] = VSW1[n] + VSW2[n]), \text{ and}$$

subtracting 2/N times the input voltage to determine a third absolute error (VSUM,ERR) according to:

$$V\text{SUM},ERR = |V\text{SUM}[n] - VIN/2|.$$

16. The method of claim 12,
wherein N=4, the first set of level-setting capacitors comprises a first capacitor and a third capacitor, and the second set of level-setting capacitors comprises a second capacitor.

17. An N-to-1 Dickson topology hybrid DC-DC power converter having at least (N−1) level-setting capacitors, an input terminal for receiving an input voltage, a ground terminal, and a switching node connected to an inductor, and operational according to an operating cycle comprising first, second and third states;

and fault detection circuit comprising:

a first measuring circuit configured to measure a first voltage, VSW1, at the switching node in the first state in which first and second sets of the level-setting capacitors are being charged and discharged;

a first calculation circuit configured to calculate a first error voltage as a difference of the first voltage in one operating cycle (VSW1[n−1]) and in a next subsequent operating cycle (VSW1 [n]);

a first fault circuit configured to provide a first fault output indicative of a fault in response to an absolute value of the first error voltage exceeding a short-circuit-trip level;

a second measuring circuit configured to measure a second voltage, VSW2, at the switching node in the second state in which the first and second sets of the level-setting capacitors are being respectively discharged and charged;

a second calculation circuit configured to calculate a second error voltage as a difference of the second voltage in one operating cycle (VSW2[n−1] and in a next subsequent operating cycle (VSW2[n]); and a second fault circuit configured to provide a second fault output indicative of a fault in response to an absolute value of the second error voltage exceeding the short-circuit-trip level.

18. The N-to-1 Dickson topology hybrid DC-DC power converter of claim 17, wherein the fault detection circuit further comprises:

a third measuring circuit configured to measure the input voltage;

a third calculation circuit configured to calculate a third error voltage as the value of: the sum of the first and the second voltage in one operating cycle minus 2/N times the input voltage; and a third fault detection circuit configured to provide a third fault output indicative of a fault in response to an absolute value of the second error voltage exceeding an open-circuit-trip level.

* * * * *